(12) United States Patent
Shiraishi et al.

(10) Patent No.: US 7,109,577 B2
(45) Date of Patent: Sep. 19, 2006

(54) SEMICONDUCTOR DEVICE AND POWER SUPPLY SYSTEM

(75) Inventors: Masaki Shiraishi, Hitachi (JP); Takayuki Iwasaki, Hitachi (JP); Nobuyoshi Matsuura, Takasaki (JP); Tomoaki Uno, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/836,277

(22) Filed: May 3, 2004

(65) Prior Publication Data

US 2004/0227547 A1    Nov. 18, 2004

(30) Foreign Application Priority Data

May 14, 2003  (JP) .............................. 2003-135686

(51) Int. Cl.
*H03K 19/01* (2006.01)

(52) U.S. Cl. ...................... 257/690; 257/666; 257/724; 363/127

(58) Field of Classification Search ........ 363/144–147, 363/127, 132; 257/690–692, 666, 698, 341–343; 438/128, 197

See application file for complete search history.

(56) References Cited

U.S. PATENT DOCUMENTS 6,137,165 A * 10/2000 Thierry ........................ 257/690
6,737,301 B1 * 5/2004 Eden et al. .................. 438/128

FOREIGN PATENT DOCUMENTS

JP         2002-9219         1/2002

* cited by examiner

*Primary Examiner*—Rajnikant B. Patel
(74) *Attorney, Agent, or Firm*—Mattingly, Stanger, Malur & Brundidge, P.C.

(57) ABSTRACT

A power MOS-FET is used as a high side switch transistor for a non-insulated DC/DC converter. An electrode section that serves as a source terminal of the power MOS-FET is connected to one outer lead and two outer leads via bonding wires respectively. The outer lead is an external terminal connected to a path for driving the gate. Each of the outer leads is an external terminal connected to a main current path. Owing to the connection of the main current path and the gate driving path in discrete form, the influence of parasitic inductance can be reduced and voltage conversion efficiency can be improved.

11 Claims, 16 Drawing Sheets

SEMICONDUCTOR DEVICE AND POWER SUPPLY SYSTEM

CROSS-REFERENCE TO RELATED APPLICATION

The present application claims priority from Japanese patent application JP 2003-135686 filed on May 14, 2003, the content of which is hereby incorporated by reference into this application.

BACKGROUND OF THE INVENTION

The present invention relates to a switching IC (Integral Circuit) used in a power supply circuit or the like, and particularly to a technique effective for application to an improvement in the power generation efficiency by a DC/DC converter.

A frequency increase of a power MOSFET (Metal Oxide Semiconductor Field Effect Transistor) used in a power supply has recently been advanced to achieve a reduction in the size of a power supply circuit or the like and a high-speed load response.

A non-insulated DC/DC converter used in a power supply circuit of a personal computer, a computer game machine or the like in particular shows a tendency to make a large current and an increase in frequency with a demand for an increase in the current flowing into a CPU or the like to be driven, and size reductions of both a choke coil corresponding to a passive part and input/output capacitance, etc.

The non-insulated DC/DC converter has been widely used in the power supply circuit of the personal computer, the computer game machine or the like, for example. The non-insulated DC/DC converter needs to achieve an improvement in efficiency and a size reduction with an increase in current and a reduction in voltage with respect to a CPU or the like mounted in an electronic system.

The non-insulated DC/DC converter comprises a high side switch and a low side switch. The switches respectively make use of a power MOS-FET (Metal Oxide Semiconductor-Field Effect Transistor).

These switches perform voltage conversion by being alternately turned ON/OFF while the high side and the low side are being synchronized with each other. The high side switch is a switch for controlling a DC/DC converter, whereas the low side switch is a synchronous rectifying switch.

As a semiconductor device in which a power MOS-FET is sealed with a resin, there is known, for example, one in which a ground electrode terminal connected to a ground electrode formed by separation of a source electrode of a semiconductor chip is provided between a gate electrode terminal and a source electrode terminal, and gold wires or like low in impedance are used to connect among the respective source, gate and ground electrodes and their corresponding electrode terminals, thereby reducing noise of the semiconductor device when driven under a high-frequency operation (see, for example, the following patent document 1).

Patent Document 1

Japanese Unexamined Patent Publication No. 2002-009219

SUMMARY OF THE INVENTION

It has, however, been found out by the present inventors that the DC/DC converter involves the following problems.

FIG. 21 is a schematic circuit configurational view of a DC/DC converter 50 discussed by the present inventors. The DC/DC converter 50 comprises a configuration wherein a high side switch 51 and a low side switch 52 each comprising a power MOS-FET are series-connected between a power supply voltage Vin and a reference voltage.

When the high side switch 51 and the low side switch 52 are respectively configured in one package, for example, parasitic inductances LdH, LsH, LdL, LgH, LgL and LsL of bonding wires and external lead wires of a semiconductor device, and wirings employed in a printed wiring board with the packages mounted thereon, etc. occur as shown in the figure.

A problem arises in that particularly when the parasitic inductance LsH of the high side switch 51 increases, turn-on and turn-off losses of the high side switch 51 become great, so that conversion efficiency is greatly reduced.

FIG. 22 is an explanatory view showing the dependence of loss components of the DC/DC converter 50 on LsH.

In FIG. 22, areas indicated by half-tone dot meshing show turn-on losses of the high side switch 51, areas indicated by hatching show turn-off losses of the low side switch 52, and open areas indicate losses of the low side switch 52, respectively.

It is understood as illustrated in the figure that when the parasitic inductance LsH increases, particularly, the turn-on loss of the high side switch 51 becomes high so that conversion efficiency is greatly reduced.

This is because when a main current flows through the parasitic inductance LsH, a back electromotive force occurs between a point A of FIG. 21 and a source terminal of the high side switch 51, so that a sufficient gate voltage cannot be applied to the high side switch 51.

Since the turn-on and turn-off losses are respectively proportional to the frequency or an output current, the loss components become larger with an increase in current and an increase in frequency.

An object of the present invention is to provide a power supply system which is capable of reducing an influence exerted on a gate voltage even when parasitic inductance is large and greatly improving voltage conversion efficiency.

Another object of the present invention is to provide a semiconductor device capable of greatly reducing parasitic inductance to thereby substantially improve voltage conversion efficiency.

The above of the present invention, and other objects and novel features thereof will become apparent from the description of the present Specification and the accompanying drawings.

A summary of a representative one of the inventions disclosed in the present application will be explained in brief as follows:

(1) The present invention provides a semiconductor device comprising a first power transistor used as a high side switch, wherein a source terminal of the first power transistor is connected to a first external connecting terminal and a second external connecting terminal respectively, and the first external connecting terminal and the second external connecting terminal are respectively formed so as to be separated from each other in different paths.

Summaries of other inventions of the present application will be described in brief.

(2) The present invention provides a semiconductor device comprising a first power transistor used as a high side switch, a second power transistor used as a low side switch, and a driver which drives the first and second power transistors, wherein a source terminal of the first power transistor is connected to a first external connecting terminal connected to a drain of the second power transistor and is connected to a source-grounded terminal provided in the driver in different paths respectively.

(3) Also the present invention provides a semiconductor device comprising a first power transistor used as a high side switch, a second power transistor used as a low side switch, and a driver controller comprising a driver which drives the first and second power transistors and a controller which generates a control signal for driving and controlling the driver, wherein a source terminal of the first power transistor is connected to a first external connecting terminal connected to a drain of the second power transistor and is connected to a source-grounded terminal provided in the driver controller in different paths respectively.

(4) Further, the present invention provides a power supply system comprising a first power transistor used as a high side switch, a driver which drives the first power transistor, a smoothing coil, and a printed wiring board on which the first power transistor, the driver and the coil are packaged, wherein a source terminal of the first power transistor is connected to a first external connecting terminal and a second external connecting terminal respectively formed so as to be separated from each other in different paths, wherein the printed wiring board has a first wiring through which a first external connecting terminal of the first power transistor is connected to the driver, and a second wiring through which a second external connecting terminal of the first power transistor and a connecting portion of the coil are connected, and wherein the first wiring and the second wiring are formed in different paths respectively.

(5) Furthermore, the present invention provides a power supply system comprising a power module comprised of a first power transistor used as a high side switch and a second power transistor used as a low side switch, a driver which drives the power module, a smoothing coil and a printed wiring board on which the power module, the driver and the coil are packaged, wherein a source terminal of the first power transistor is connected to a first external connecting terminal and a second external connecting terminal respectively formed so as to be separated from each other in different paths, wherein the printed wiring board has a first wiring through which a first external connecting terminal of the first power transistor is connected to the driver, and a second wiring through which a second external connecting terminal of the first power transistor and a connecting portion of the coil are connected, and wherein the first wiring and the second wiring are formed in different paths respectively.

DETAILED DESCRIPTION OF THE INVENTION

Preferred embodiments of the present invention will hereinafter be described in detail in accordance with the accompanying drawings.

Embodiment 1

Figure 1:
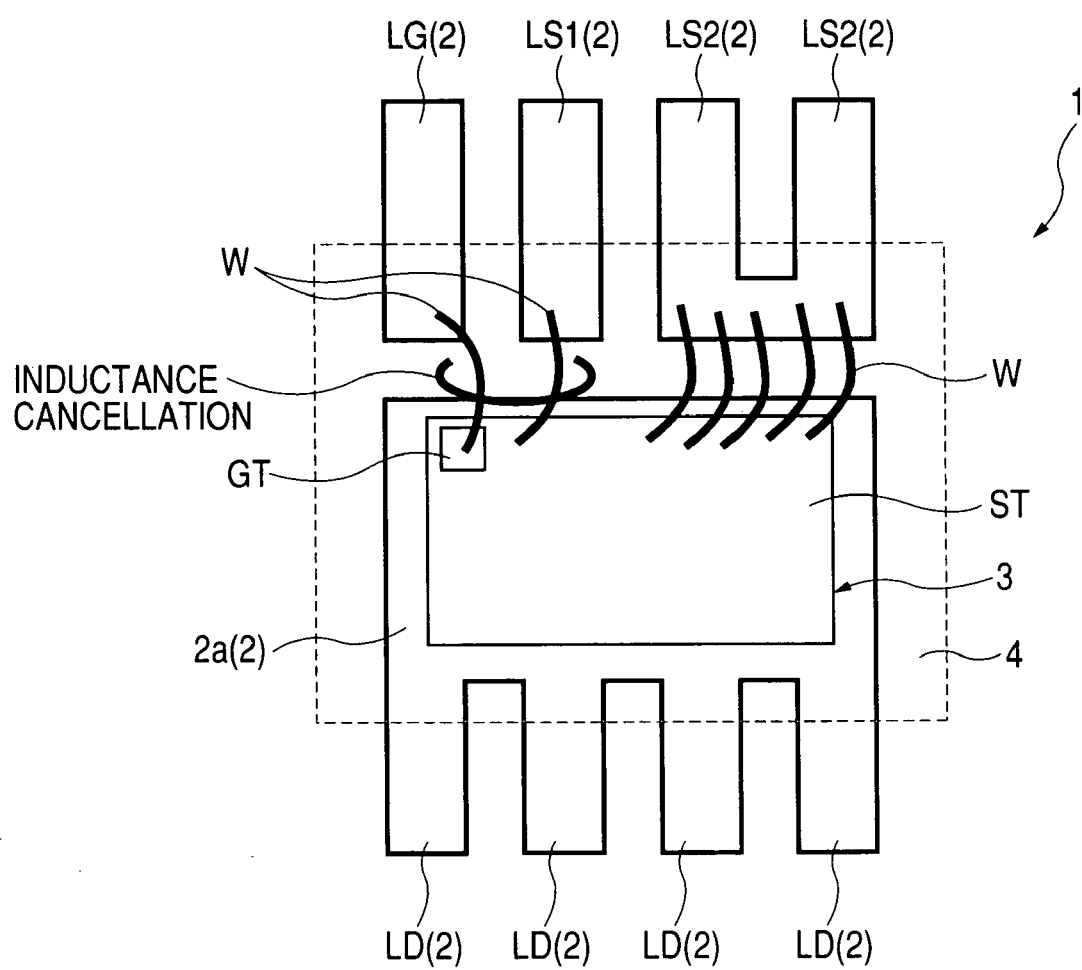
FIG. 1 is an explanatory view showing one example of a configuration of a power MOS-FET according to an embodiment 1 of the present invention.
Figure 2:
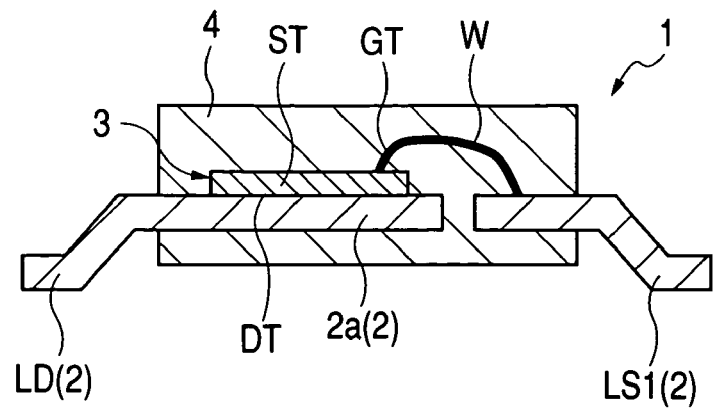
FIG. 2 is a cross-sectional view of the power MOS-FET shown in FIG. 1.
Figure 3:
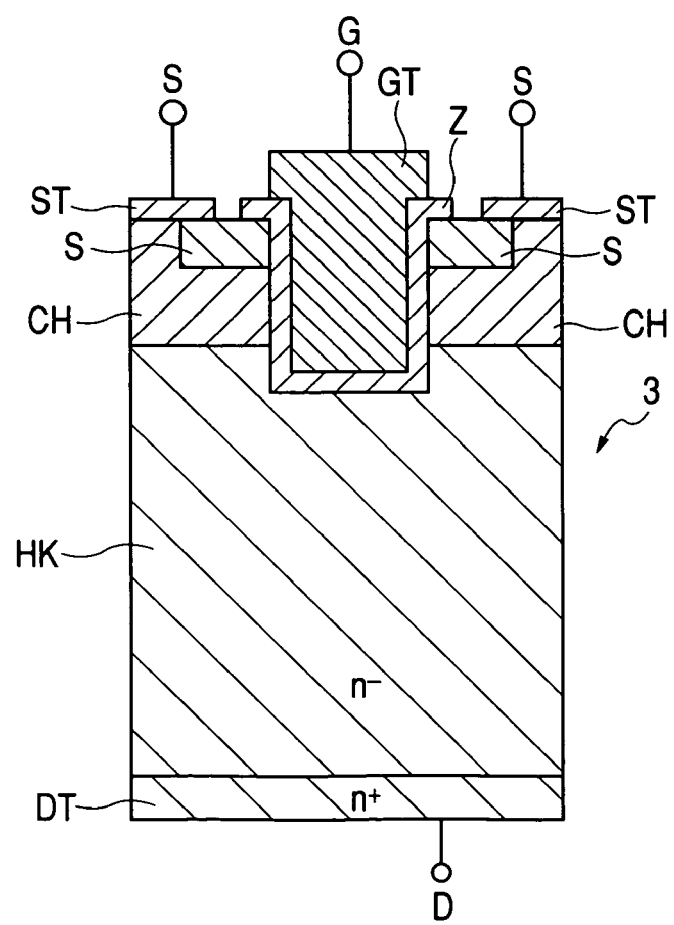
FIG. 3 is an explanatory view illustrating one example of a chip layout in the power MOS-FET shown in FIG. 1.
Figure 4:
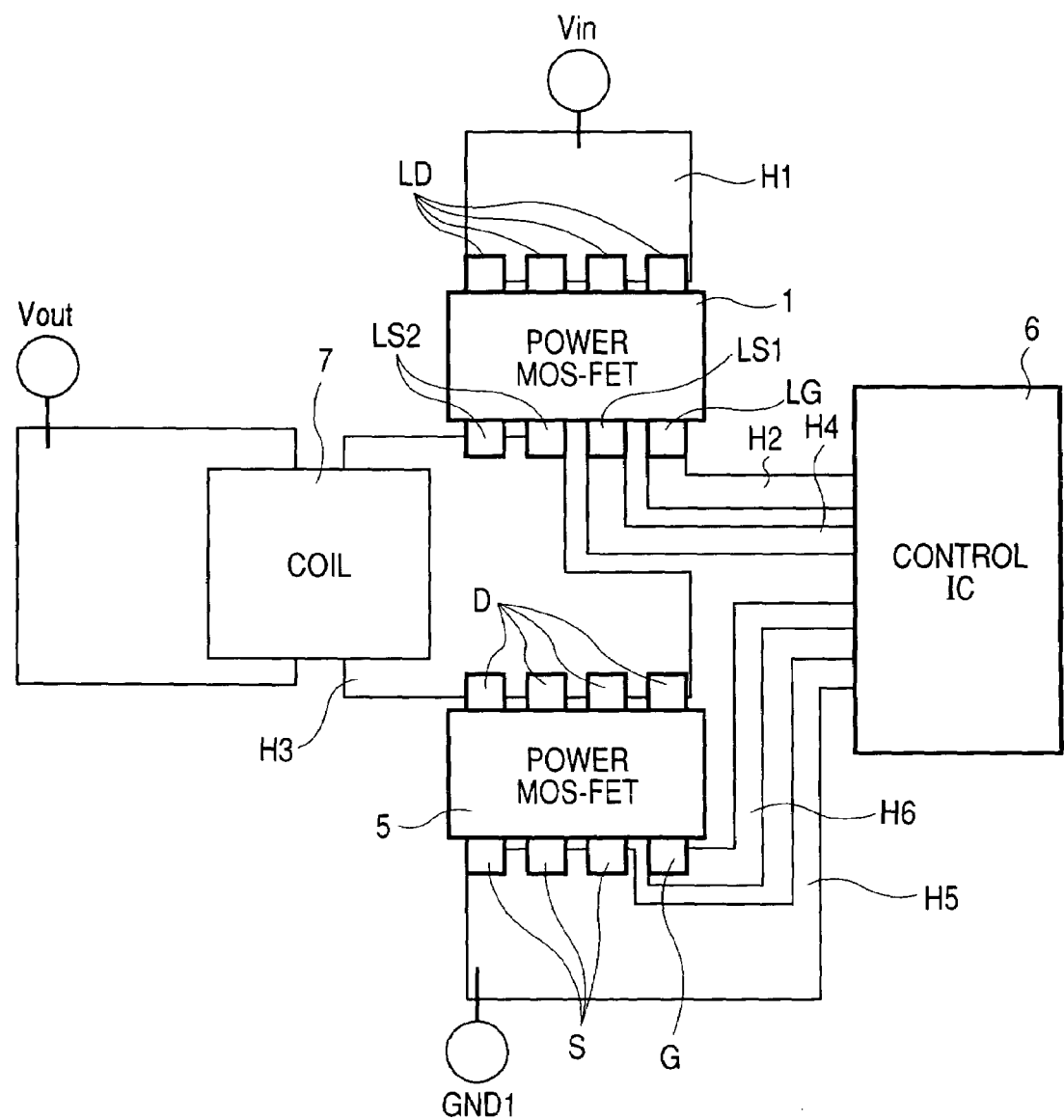
FIG. 4 is an explanatory view showing an example of packaging of a printed wiring board on which a DC/DC converter is configured using the power MOS-FET shown in FIG. 1.
Figure 5:
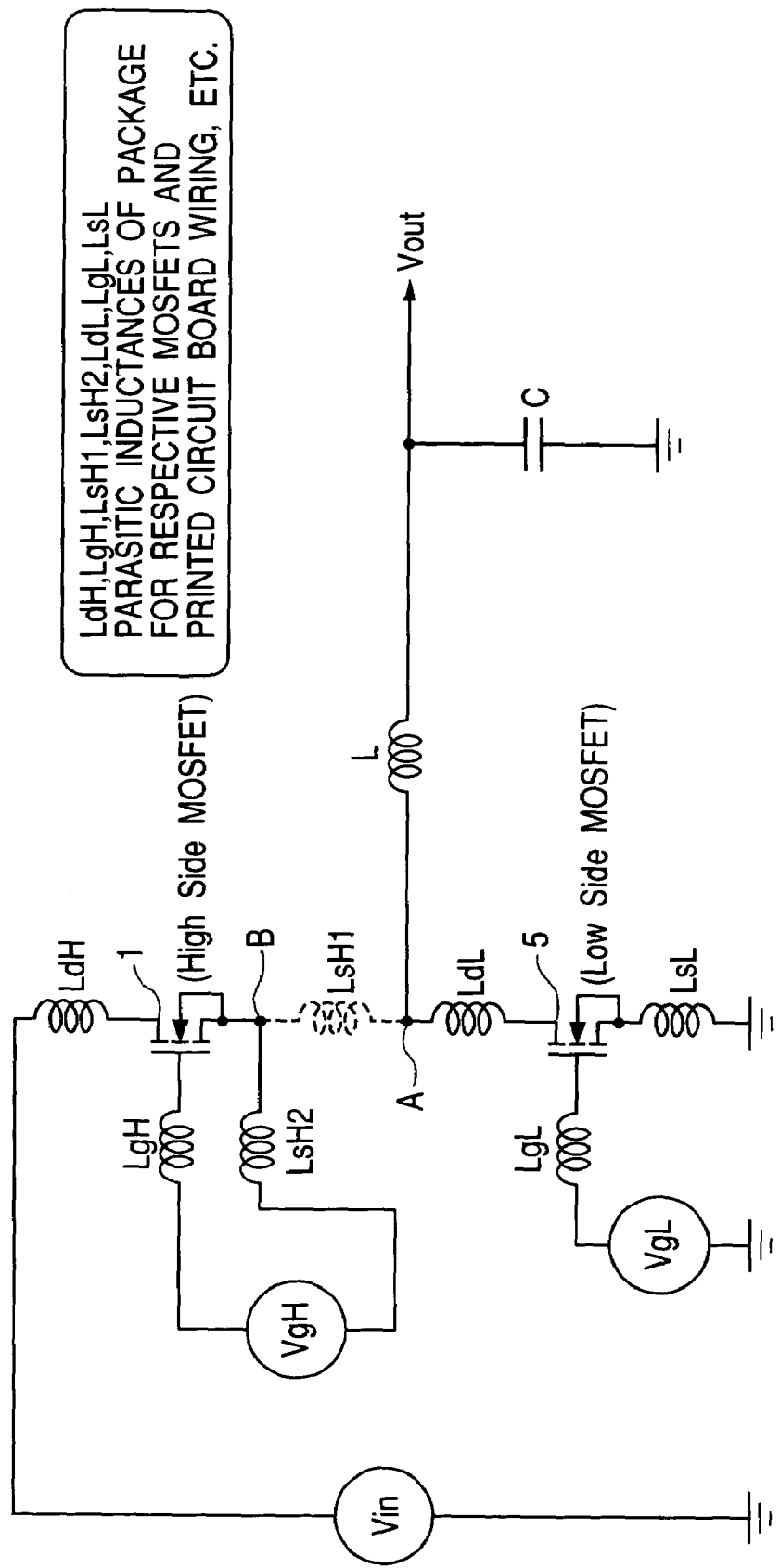
FIG. 5 is an equivalent circuit diagram of the DC/DC converter packaged on the printed wiring board shown in FIG. 4.
Figure 6:
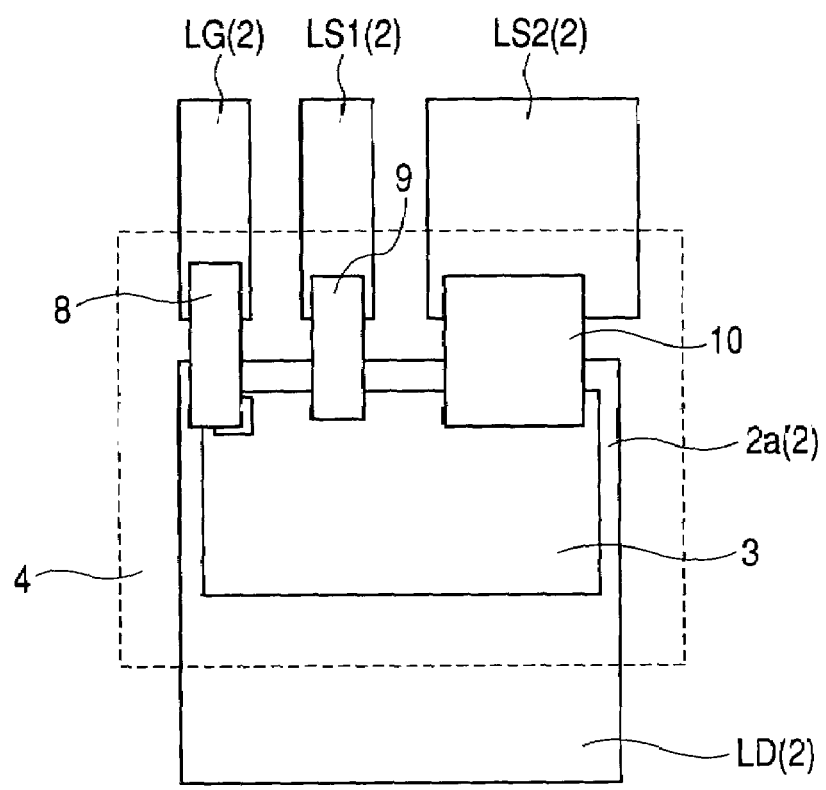
FIG. 6 is an explanatory view showing another configurational example of the power MOS-FET shown in FIG. 1.
Figure 7:
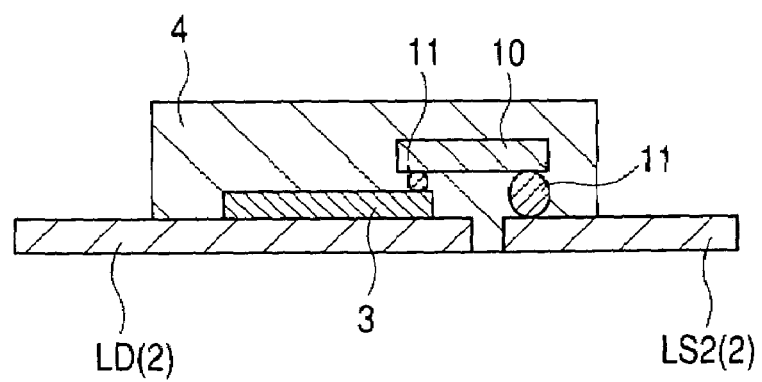
FIG. 7 is a cross-sectional view of the power MOS-FET shown in FIG. 6.
Figure 8:
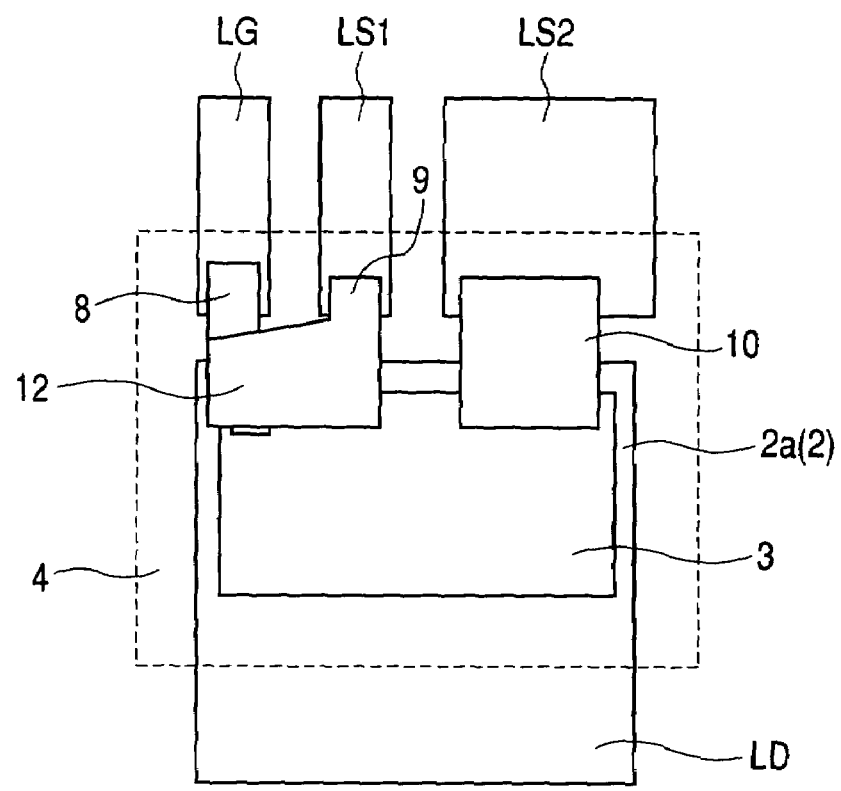
FIG. 8 is an explanatory view showing a further configurational example of the power MOS-FET shown in FIG. 7.
Figure 9:
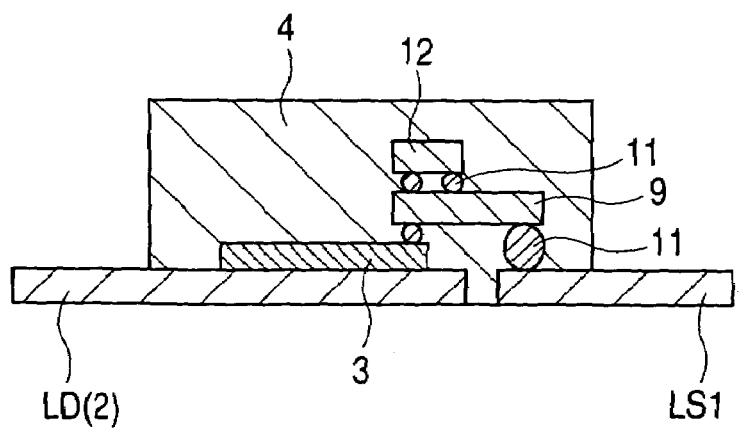
FIG. 9 is a cross-sectional view of the power MOS-FET shown in FIG. 8.
Figure 23:
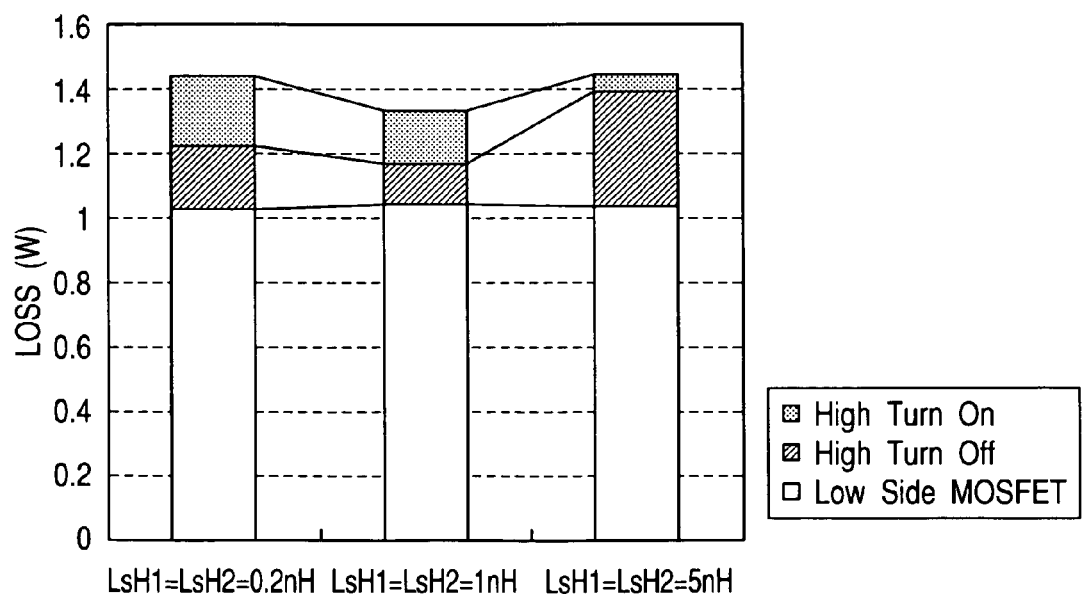
FIG. 23 is an explanatory view illustrating the dependence of a loss component developed in the DC/DC converter of FIG. 5 on parasitic inductance.

FIG. 1 is an explanatory view showing one example of a configuration of a power MOS-FET according to an embodiment 1 of the present invention, FIG. 2 is a cross-sectional view of the power MOS-FET shown in FIG. 1, FIG. 3 is an explanatory view illustrating one example of a chip layout in the power MOS-FET shown in FIG. 1, FIG. 4 is an explanatory view showing an example of packaging of a printed wiring board on which a DC/DC converter is configured using the power MOS-FET shown in FIG. 1, FIG. 5 is an equivalent circuit diagram of the DC/DC converter packaged on the printed wiring board shown in FIG. 4, FIG. 6 is an explanatory view showing another configurational example of the power MOS-FET shown in FIG. 1, FIG. 7 is a cross-sectional view of the power MOS-FET shown in FIG. 6, FIG. 8 is an explanatory view showing a further configurational example of the power MOS-FET shown in FIG. 7, FIG. 9 is a cross-sectional view of the power MOS-FET shown in FIG. 8, and FIG. 23 is an explanatory view illustrating the dependence of a loss developed in the DC/DC converter of FIG. 5 on parasitic inductance.

In the present embodiment, the power MOS-FET (a first power transistor and a semiconductor device) 1 is a high side switch transistor of a non-insulated DC/DC converter used as a power supply system. This comprises a package such as an SOP (Small Outline Package).

A package configuration of the power MOS-FET 1 includes a semiconductor chip 3 mounted on a die pad 2a provided in the center of a lead frame 2 as shown in FIGS. 1 and 2. Electrode sections that serve as a source terminal ST of the power MOS-FET 1 and a gate terminal GT thereof are formed in a main surface of the semiconductor chip 3. An electrode section that serves as a drain terminal DT of the power MOS-FET 1 is formed on the back surface of the semiconductor chip 3.

In the semiconductor chip 3 as shown in FIG. 3, a gate terminal GT is formed in the center thereof on a semiconductor substrate HK with an insulating film Z interposed therebetween. Source terminals ST are formed on both sides, respectively, of the gate terminal GT with channel portions interposed therebetween. The back surface of the semiconductor substrate HK serves as a drain terminal DT.

The electrode section that serves as the gate terminal GT of the power MOS-FET 1 is formed in part of the upper left portion of the main surface of the semiconductor chip 3 shown in FIGS. 1 and 2. The other main surface serves as the electrode section of the source terminal ST. These electrode sections are formed by vapor deposition of a metal such as aluminum (Al), for example.

An electrode section that servers as the drain terminal DT of the power MOS-FET 1 is formed on the back surface of the semiconductor chip 3. The electrode section is formed by vapor deposition of a metal such as gold (Au). The back surface of the semiconductor chip 3 is press-fit onto the die pad 2a.

Then, the die pad 2a to which the drain terminal DT of the power MOS-FET 1 is connected, extends and thereby serves a plurality of (four) outer leads LDs that serve as external or outgoing lead wires or lines.

The electrode section that serves as the gate terminal GT of the power MOS-FET 1 is connected to its corresponding outer lead LG via a bonding wire W formed of, for example, gold or the like. The electrode section that serves as the source terminal ST of the power MOS-FET 1 is connected to one outer lead (first external connecting terminal) LS1 and two outer leads (second external connecting terminal) LS2, respectively, through bonding wires W formed of, for example, gold or the like.

These die pad 2a, semiconductor chip 3, outer leads LG, LS1 and LS2, part of LG and bonding wires W are sealed with an encapsulating resin, so that a package 4 is formed.

The outer lead LS1 is an external terminal connected to a path for driving the gate of the power MOS-FET 1, whereas the outer lead LS2 is an external terminal connected to a main current path through which a voltage-converted voltage is outputted.

Since the outer lead LG and the outer lead LS1 are provided side-by-side with each other in the power MOS-FET 1, a backward current flows in each of their parasitic inductances, thereby making it possible to reduce the inductance of the gate terminal GT of the power MOS-FET 1.

Since the inductance of the gate terminal GT can be reduced, the switching speed of the power MOS-FET 1 can be made fast, so that a switching loss can be reduced.

A great effect can be brought about in that the reduction of the inductance of the gate terminal GT of the power MOS-FET 1 enables prevention of self turn-on of the power MOS-FET used as a low side switch.

The self turn-on is a phenomenon that when a diode built in the power MOS-FET used as the low side switch is changed over from a reflowing mode to a mode in which the high side switch is turned ON, the voltage of the gate of the low side switch rises, thereby causing the low side switch to malfunction.

FIG. 4 is a view showing packaging of a printed wiring board on which a DC/DC converter (power supply system) is configured using the power MOS-FET 1 shown in FIGS. 1 and 2. Although not shown in FIG. 4, input and output condensers, etc. are also actually packaged on it.

The DC/DC converter comprises the power MOS-FET 1, a power MOS-FET (second power transistor) 5 used as the low side switch, a control IC 6 and a coil 7. They are packaged on the printed wiring board.

As illustrated in the figure, the control IC 6 is packaged on the right side of the printed wiring board. The control IC 6 is a driver that drives the power MOS-FETs 1 and 5, respectively, based on control signals inputted from outside.

The power MOS-FET 1 is packaged on the upper left side of the control IC 6. The power MOS-FET 5 that serves as the low side switch is packaged below the power MOS-FET 1. The coil 7 is packaged on the left sides of these power MOS-FETs 1 and 5.

An input voltage Vin is connected to four outer leads LDs of the power MOS-FET 1 through a pattern wiring H1. One output terminal of the control IC 6 is connected to an outer lead LG of the power MOS-FET 1 via a pattern wiring H2.

One of connecting portions of the coil 7 is connected to two outer leads LS2 of the power MOS-FET 1 via a pattern wiring (second wiring) H3. A ground terminal on the source side, of the control IC 6 is connected to an outer lead LS1 of the power MOS-FET 1 via a pattern wiring (first wiring) H4.

Further, the power MOS-FET 5 is provided with four outer leads D, three outer leads S and one outer lead G as drain, source and gate terminals of the power MOS-FET 5, respectively.

The outer leads D of the power MOS-FET 5 are connected to the pattern wiring H3. A ground terminal GND1 of the control IC 6 is connected to the outer leads S via a pattern wiring H5. The other output terminal of the control IC 6 is connected to the outer lead G via a pattern wiring H6.

Thus, the printed wiring board has a configuration wherein the outer lead LS1 and the ground terminal on the source side, of the control IC 6 are connected to each other by the dedicated pattern wiring H4, and a gate driving path of the power MOS-FET 1 and its main current path are separated from each other.

FIG. 5 is an equivalent circuit diagram of the DC/DC converter packaged on the printed wiring board shown in FIG. 4.

As shown in FIG. 5, a path through which a main current flows from the source electrode of the power MOS-FET 1 used as the high side switch, and a source-grounded path for driving the gate of the power MOS-FET 1 are separated from each other. Thus, even when parasitic inductances LsH1 and LsH2 increase, the gate voltage of the power MOS-FET 1 is not affected thereby.

Referring to FIG. 4, the printed wiring board is configured as a multilayered wiring board and the pattern wirings H2 and H4 are superimposed thereon, thereby making it possible to further reduce the parasitic inductance of the gate terminal.

Further, in the printed wiring board shown in FIG. 4, the pattern wiring H5 for the outer leads S (source terminal) of the power MOS-FET 5 is provided in a separated form, or the power MOS-FET 5 is configured as shown in FIGS. 1 and 2 and the pattern wiring H5 is separated and superimposed on the multilayered wiring board, in a manner similar to the power MOS-FET 1, thereby making it possible to prevent a self turn-on phenomenon of the power MOS-FET 5.

FIG. 23 illustrates the dependence of losses developed in the DC/DC converter of FIG. 5 on the parasitic inductances LsH1 and LsH2. Respective areas indicate losses identical to those shown in FIG. 22.

Figure 22:
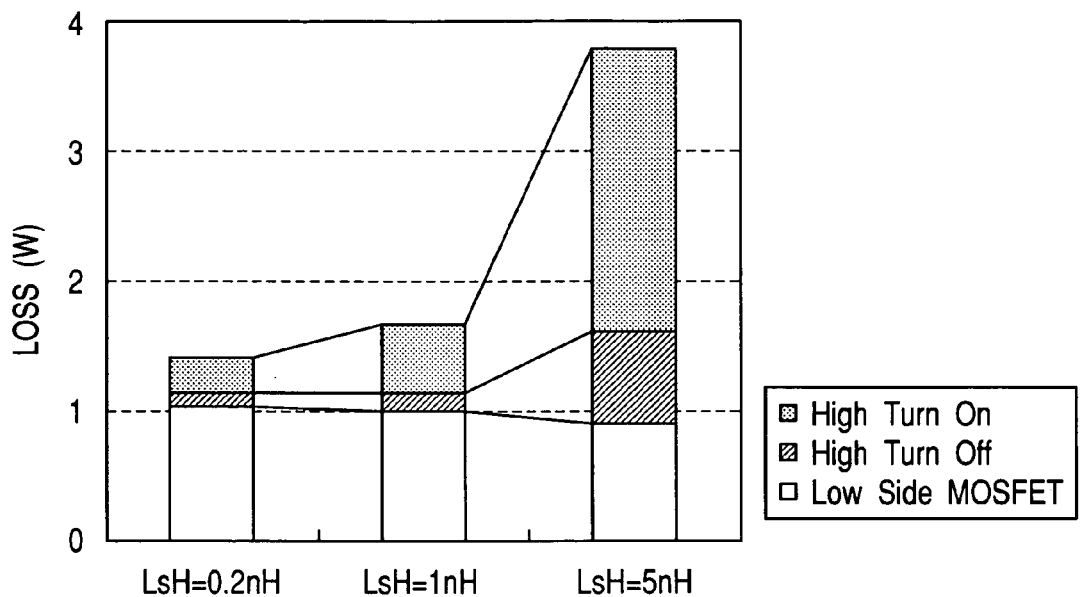
FIG. 22 is an explanatory view showing the dependence of a loss component developed in the DC/DC converter of FIG. 21 on parasitic inductance L.

As is understood by comparison with FIG. 22, it is understood that a turn on loss and a turn off loss of the high side switch do not change so much even when the parasitic inductances LsH1 and LsH2 increase, and hence the total loss remains unchanged.

This is because the path through which the main current flows from the source electrode of the power MOS-FET 1 used as the high side switch, and the source-grounded path for driving the gate of the power MOS-FET 1 are separated from each other, and a back electromotive force developed due to the flowing of the main current to the parasitic inductances is almost unproduced in the path for driving the gate and a sufficient gate voltage can be applied to the high side switch 1.

The power MOS-FET 1 may take one other than the configuration shown in FIGS. 1 and 2. For instance, the inductance and resistance may be further reduced without using the bonding wires (see FIGS. 1 and 2).

As to the power MOS-FET 1 in this case, a drain terminal DT of the power MOS-FET 1 and outer leads LS1 and LS2, and its gate terminal GT and an outer lead LG are respectively connected to one another through metal plates 8 through 10 each made of aluminum (Al) or copper (Cu) or the like as shown in FIGS. 6 and 7.

These metal plates 8 through 10 and the drain terminal DT, gate terminal GT and source terminal of the semiconductor chip 3, and the metal plates 8 through 10 and the outer leads LS1, LS2, LG and LD are respectively connected to one another via solder balls 11.

Also, a package 4 is formed such that a lead frame 2 that serves as the back surface of the power MOS-FET 1 is exposed. Hence the thermal resistance of the lead frame 2 is reduced to further improve heat dissipation.

Further, the power MOS-FET 1 may be configured in such a manner that as shown in FIGS. 8 and 9, a metal plate 12 for connecting the outer lead LG and the outer lead LS1 is provided in such a configuration as shown in FIGS. 6 and 7 and they may be connected via solder balls 11.

It is, therefore, possible to further improve the effect of canceling out the inductance by the backward current that flows through each parasitic inductance and further reduce the inductance of the gate terminal GT of the power MOS-FET 1.

Thus, according to the present embodiment, the source terminal ST is provided with being separated into the outer lead LS1 and the outer lead LS2. Therefore, the path through which the main current flows from the source electrode of the power MOS-FET 1, and the source-connected path for driving the gate of the power MOS-FE 1 can be separated from each other.

Thus, the influence of an electromotive force developed due to the flowing of a main current to each parasitic inductance on a gate voltage for driving the power MOS-FET can be prevented, thereby making it possible to improve voltage transfer efficiency and cope even with a large current and a high frequency.

In the printed wiring board, the outer lead LS1 and the source-grounded terminal of the control IC 6 are connected to each other by the pattern wiring H4, and the path for driving the gate of the power MOS-FET 1 and its main current path are separated from each other, whereby the influence of each parasitic inductance of the power MOS-FET1 can be further reduced and conversion efficiency can be greatly improved.

Embodiment 2

Figure 10:
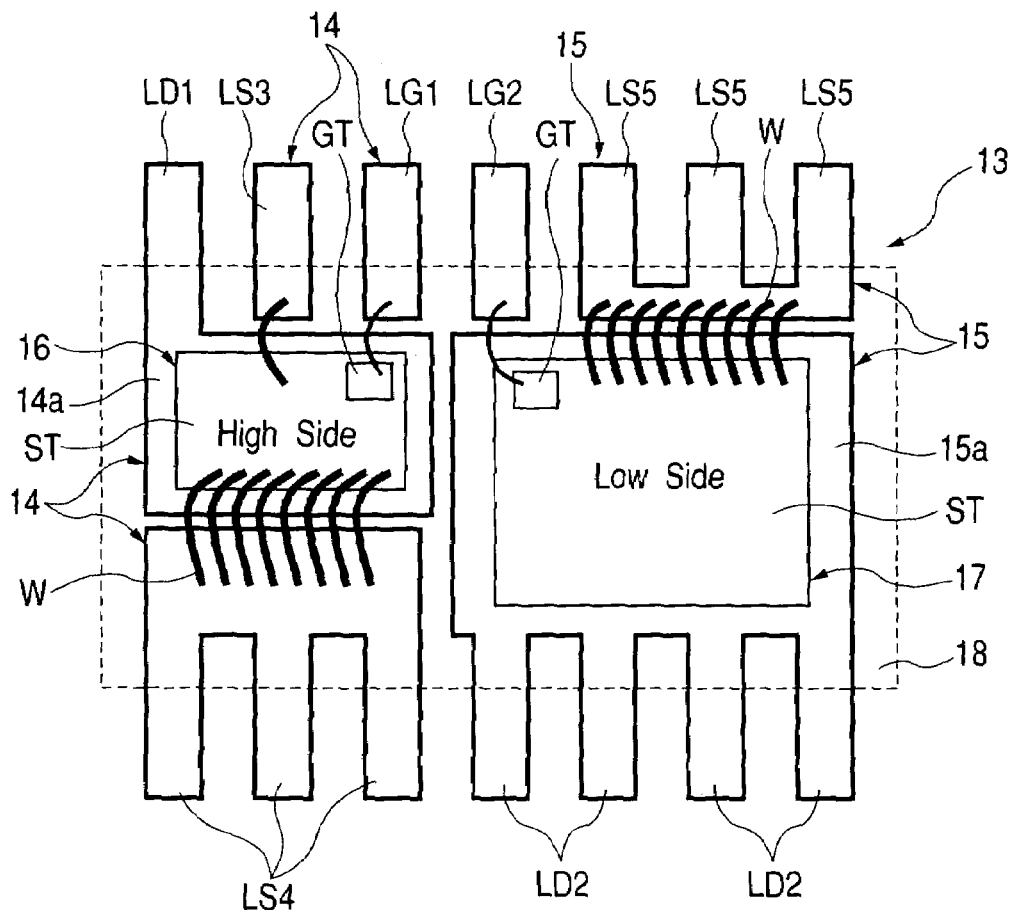
FIG. 10 is an explanatory view showing one example of a configuration of a power IC according to an embodiment 2 of the present invention.
Figure 11:
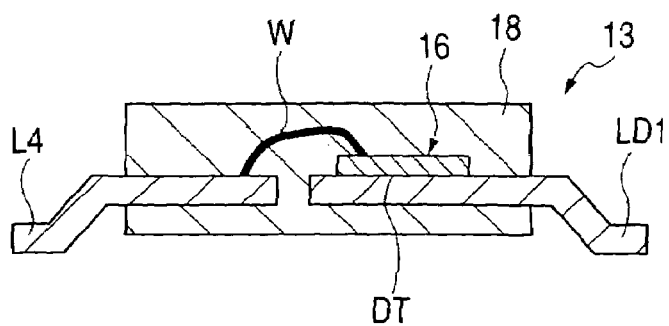
FIG. 11 is a cross-sectional view of the power IC shown in FIG. 10.
Figure 12:
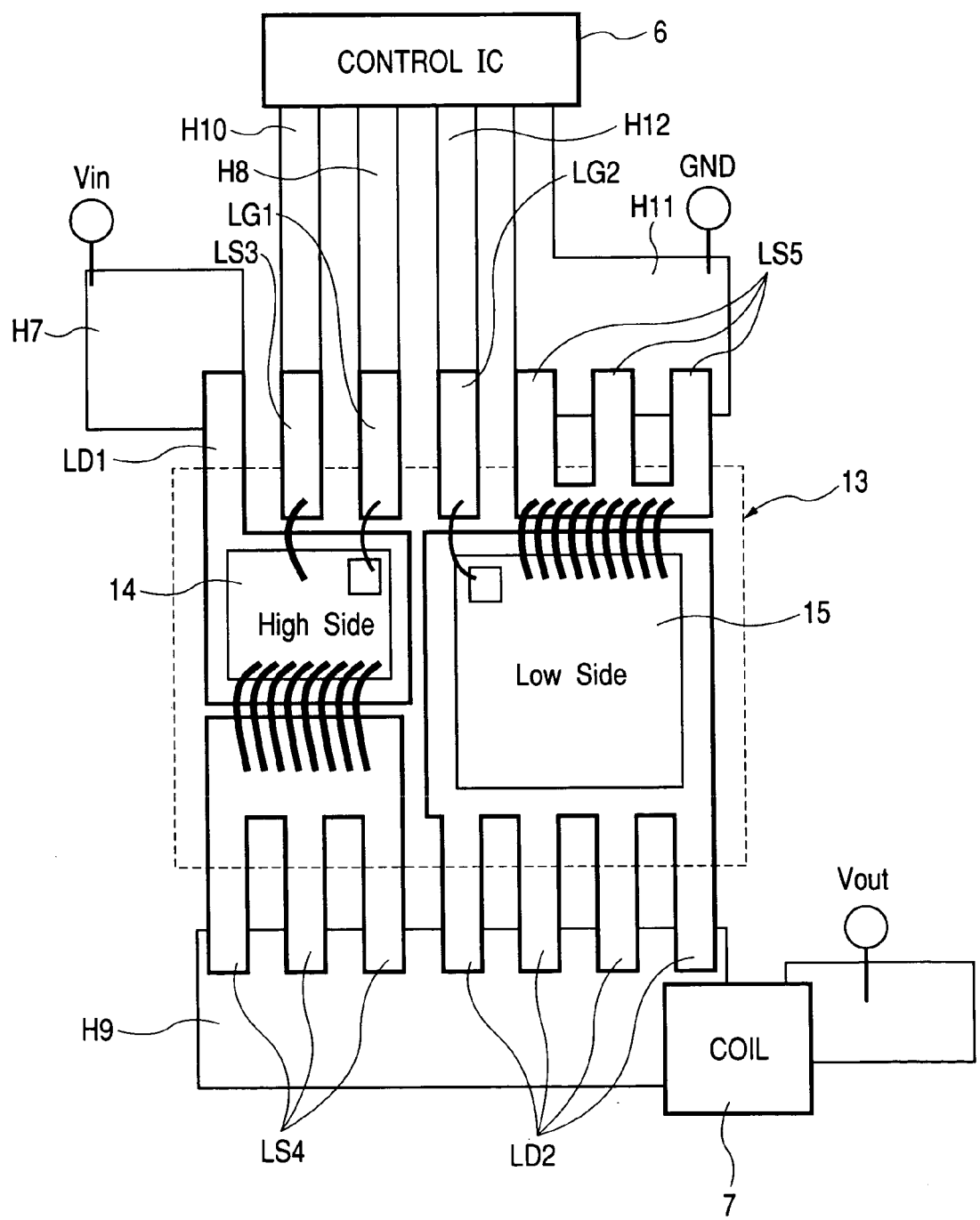
FIG. 12 is an explanatory view illustrating an example of packaging of a printed wiring board on which a DC/DC converter is configured using the power IC shown in FIG. 10.

FIG. 10 is an explanatory view showing one example of a configuration of a power IC according to an embodiment 2 of the present invention, FIG. 11 is a cross-sectional view of the power IC shown in FIG. 10, and FIG. 12 is an explanatory view illustrating an example of packaging of a printed wiring board on which a DC/DC converter is configured using the power IC shown in FIG. 10, respectively.

In the present embodiment 2, the power IC (power module) 13 is a semiconductor device in which two of a high side switch transistor of a non-insulated DC/DC converter used as a power supply system and a low side switch transistor are provided in one package. Both of the transistors of the power IC 13 comprise power MOS-FETs.

A package configuration of the power IC 13 includes semiconductor chips 16 and 17 respectively mounted on die pads 14a and 15a provided in the centers of lead frames 14 and 15 as shown in FIGS. 10 and 11. Here, the semiconductor chip 16 is a power MOS-FET for a high side switch, and the semiconductor chip 17 is a power MOS-FET for a low side switch.

Electrode sections that serve as a source terminal ST and a gate terminal GT are respectively formed in main surfaces of the semiconductor chips 16 and 17. Electrode sections that serve as drain terminals DT are formed on the back surfaces of the semiconductor chips 16 and 17.

The electrode sections that serves as the gate terminals GT are formed in part of the upper right portion of the main surface of the semiconductor chip 16 and part of the upper left portion of the main surface of the semiconductor chip 17 respectively. The other main surfaces serve as the electrode sections of the source terminals ST. These electrode sections are formed by vapor deposition of a metal such as aluminum (Al), for example.

An electrode section that servers as the drain terminal DT is formed on each of the back surfaces of the semiconductor chips 16 and 17. The electrode section is formed by vapor deposition of a metal such as gold (Au). The back surfaces of the semiconductor chips 16 and 17 are respectively press-fit onto the die pads 14a and 15a.

In the semiconductor chip 16, the die pad 14a to which the drain terminal DT is connected, extends and thereby serves as an outer lead LD1 that serve as an external or outgoing lead wire.

Further, the electrode section that serves as the gate terminal GT is connected to its corresponding outer lead LG1 via a bonding wire W formed of, for example, gold or the like. The electrode section that serves as the source terminal ST is connected to an outer lead (first external connecting terminal) LS1 and outer leads (second external connecting terminal) LS4, respectively, through bonding wires W formed of, for example, gold or the like.

In the semiconductor chip 17, the die pad 15a to which the drain terminal DT is connected, extends and thereby serves as a plurality of outer leads LD2 that serve as external or outgoing lead wires.

Further, the electrode section that serves as the gate terminal GT is connected to its corresponding outer lead LG2 via a bonding wire W formed of, for example, gold or the like. The electrode section that serves as the source terminal ST is connected to a plurality of outer leads LS5 via bonding wires W formed of, for example, gold or the like, respectively.

These die pads 14a and 15a, semiconductor chips 16 and 17, parts of outer leads LD1, LD2, LG1, LG2, LS3, LS4 and LS5, and bonding wires W are sealed with an encapsulating resin, so that a package 18 is formed.

Even in this case, the semiconductor chip 16 that serves as the power MOS-FET of the high side switch is provided in such a manner that the source terminal ST is separated into the outer lead LS3 connected to a path for driving the gate of the power MOS-FET and the outer leads LS4 each connected to a main current path.

Thus, the path through which a main current flows from the source electrode of the power MOS-FET that serves as the high side switch, and the source-grounded path for driving the gate of the power MOS-FET can be separated from each other.

Forming the two power MOS-FETs of the high side switch and the low side switch in one package 18 makes it possible to realize a reduction in the size of the power supply system, reductions in wiring inductance and resistance, etc. upon configuration of the power supply system.

FIG. 12 is a view showing packaging of a printed wiring board on which a DC/DC converter is configured using the power IC 13 shown in FIGS. 10 and 11.

The DC/DC converter comprises the power IC 13, a control IC 6 and a coil 7. They are packaged on the printed wiring board.

As illustrated in the figure, the control IC 6 is packaged above the printed wiring board. The power IC 13 is packaged below the control IC 6. The coil 7 is mounted on the lower right side of the power IC 13.

An input voltage Vin is connected to its corresponding outer lead LD1 through a pattern wiring H7. One output terminal of the control IC 6 is connected to an outer lead LG1 via a pattern wiring H8.

One of connecting portions of the coil 7 is connected to three outer leads LS4 via a pattern wiring (second wiring) H9. A ground terminal on the source side, of the control IC 6 is connected to an outer lead LS3 via a pattern wiring (first wiring) H10.

A pattern wiring H9 is connected to an outer lead LD2. A ground terminal GND1 of the control IC 6 is connected to an outer lead LS5 via a pattern wiring H11. The other output terminal of the control IC 6 is connected to an outer lead LG2 via a pattern wiring H12.

Even in this case, the printed wiring board has a configuration wherein the outer lead LS3 and the ground terminal on the source side, of the control IC 6 are connected to each other by the dedicated pattern wiring H10, and a gate driving path of the power IC 13 and its main current path are separated from each other.

Thus, in the present embodiment 2, the voltage is applied between the gate and source of the power MOS-FET of the high side switch with no its delay. Therefore, voltage conversion efficiency can be improved because a switching time interval of the power MOS-FET can be shortened.

Even in the power IC 13, the outer leads LS5 of the power MOS-FET that serves as the low side switch may be provided in a separated fashion in a manner similar to the power MOS-FET that serves as the high side switch.

Further, the printed wiring board shown in FIG. 12 is configured as a multilayered wiring board and the pattern wirings H8 and H10 are wired in superimposed form, thereby making it possible to further reduce the parasitic inductance of the gate terminal.

Embodiment 3

Figure 13:
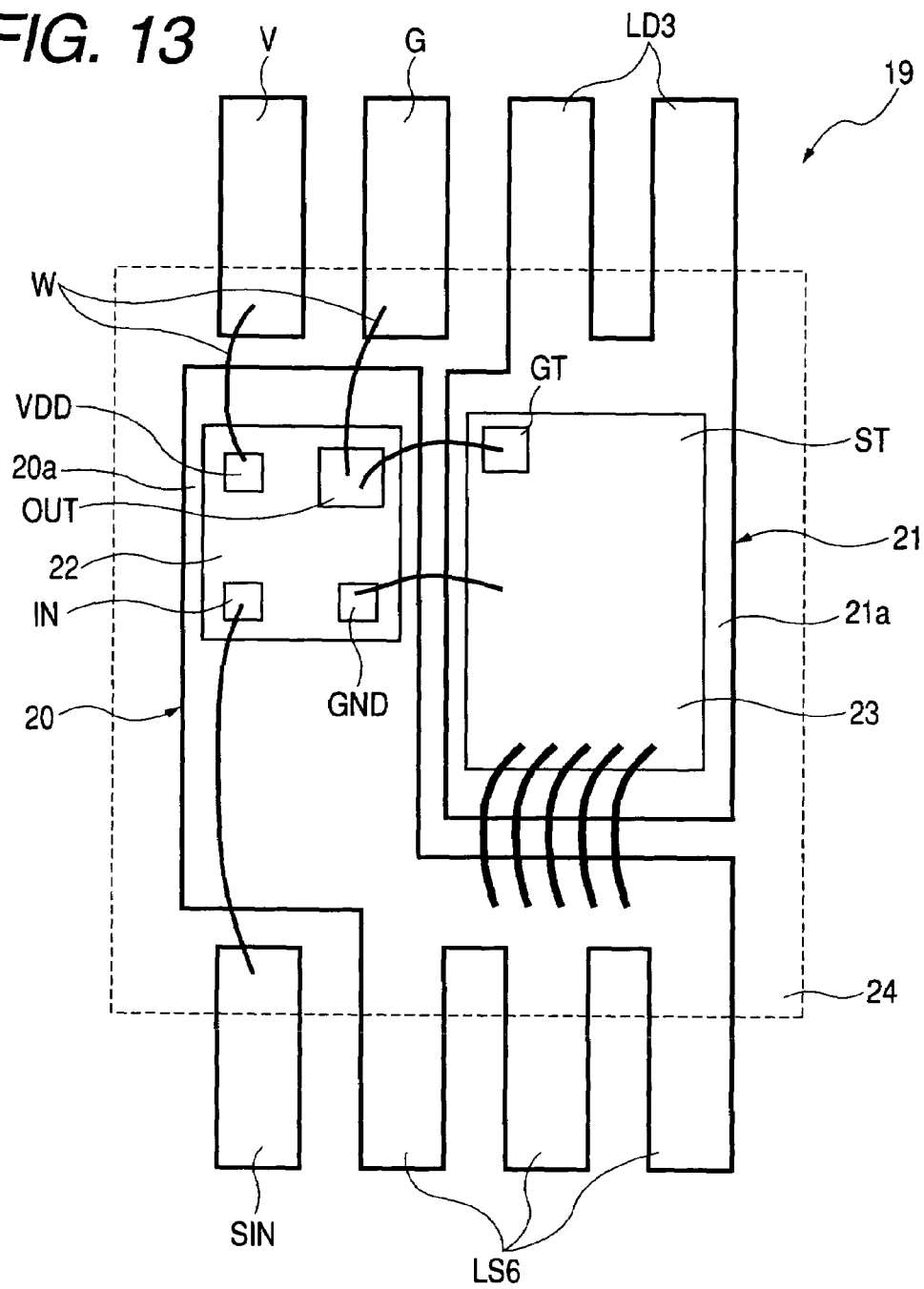
FIG. 13 is an explanatory view showing one example of a configuration of a power IC according to an embodiment 3 of the present invention.
Figure 14:
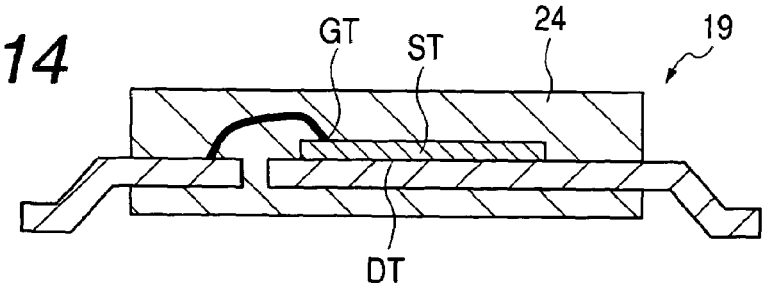
FIG. 14 is a cross-sectional view of the power IC shown in FIG. 13.
Figure 15:
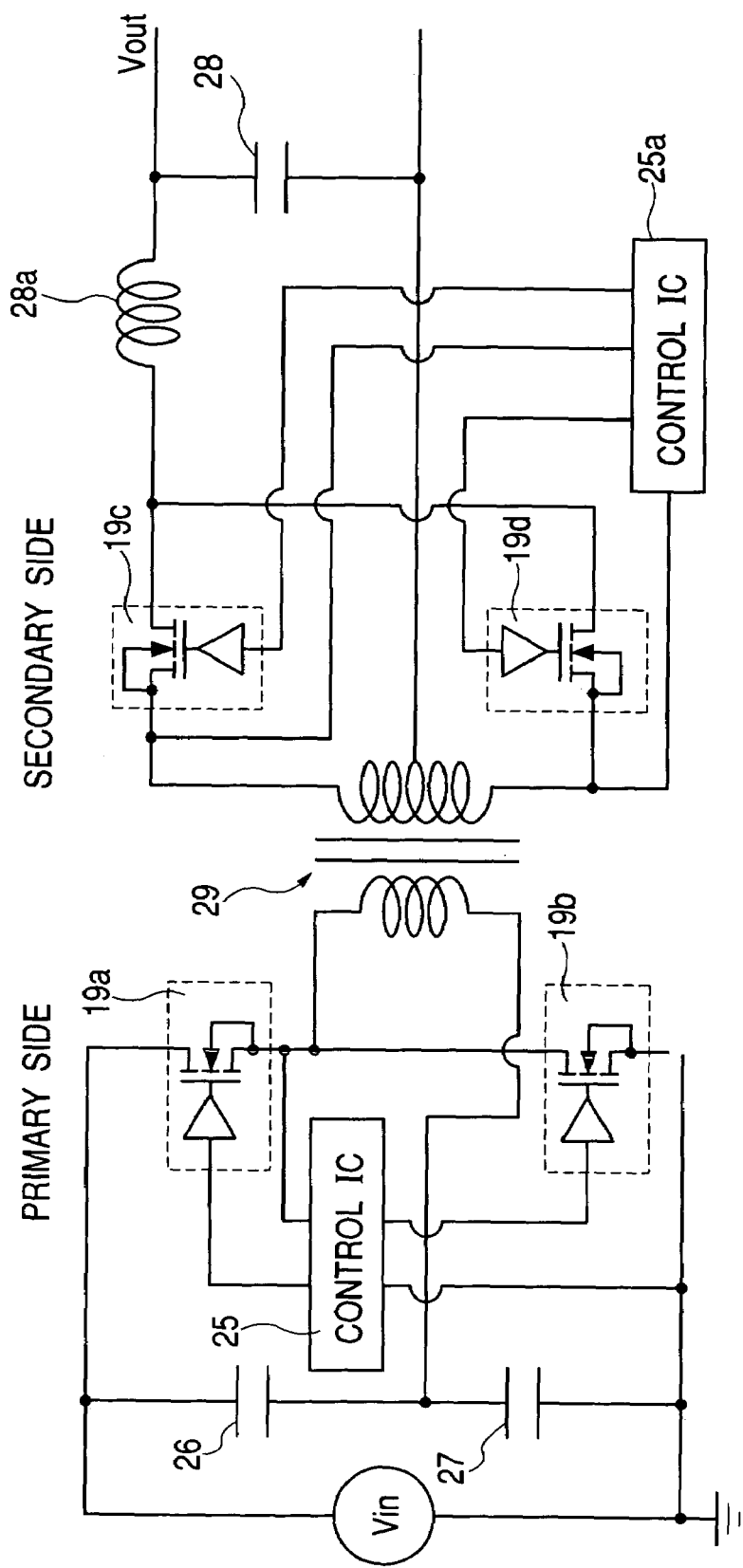
FIG. 15 is a circuit diagram showing a configurational example of an insulated type DC/DC converter using the power IC shown in FIG. 13.
Figure 16:
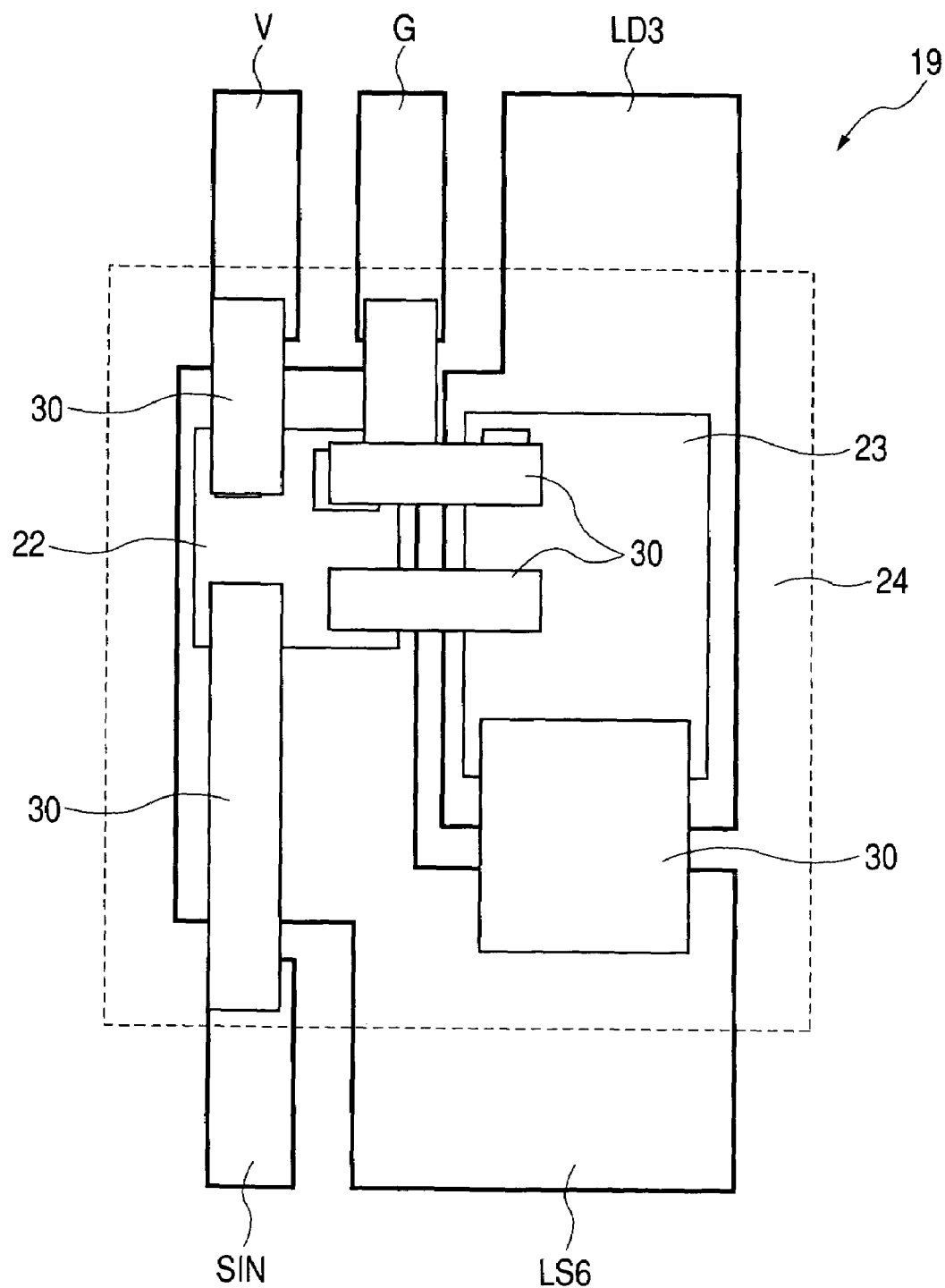
FIG. 16 is an explanatory view illustrating another configurational example of the power IC shown in FIG. 13.
Figure 17:
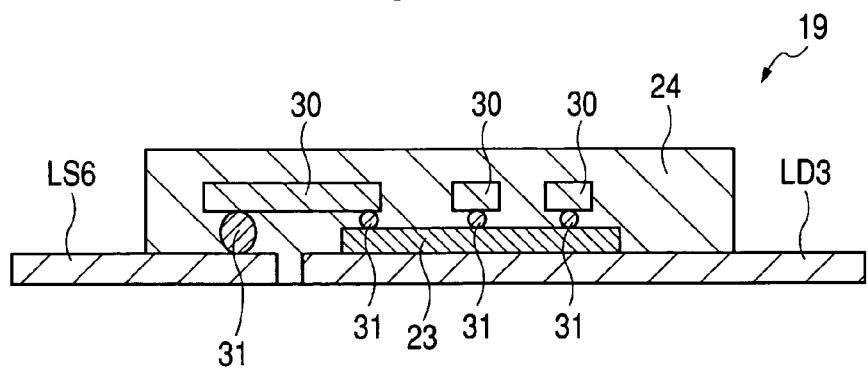
FIG. 17 is a cross-sectional view of the power IC shown in FIG. 16.

FIG. 13 is an explanatory view showing one example of a configuration of a power IC according to an embodiment 3 of the present invention, FIG. 14 is a cross-sectional view of the power IC shown in FIG. 13, FIG. 15 is a circuit diagram showing a configurational example of an insulated type DC/DC converter using the power IC shown in FIG. 13, FIG. 16 is an explanatory view illustrating another configurational example of the power IC shown in FIG. 13, and FIG. 17 is a cross-sectional view of the power IC shown in FIG. 16, respectively.

In the present embodiment 3, the power IC (power module) 19 is a semiconductor device in which a power MOS-FET and a driver for driving the power MOS-FET is provided in one package.

The power IC 19 includes semiconductor chips 22 and 23 respectively mounted on die pads 20a and 21a provided in the centers of lead frames 20 and 21 as shown in FIGS. 13 and 14. Here, the semiconductor chip 22 is a driver and the semiconductor chip 23 is a power MOS-FET.

Electrode sections that serve as a power supply voltage terminal VDD, a control signal input terminal IN, an output terminal OUT and a source-grounded terminal GND are respectively formed in a main surface of the semiconductor chip 22.

A power supply voltage for applying a gate voltage is supplied to the power supply voltage terminal VDD. A control signal is inputted to the control signal input terminal IN. The output terminal OUT outputs a signal for driving the power MOS-FET. The semiconductor chip 22 is press-fit onto the die pad 20a via a die bonding material such as silver paste.

Electrode sections that serve as a source terminal ST and a gate terminal GT are respectively formed in a main surface of the semiconductor chip 23. Electrode sections each of which serves as a drain terminal DT, are respectively formed in the back surface of the semiconductor chip 23.

The electrode section that serves as the gate terminal GT is formed in part of the upper left portion of the main surface of the semiconductor chip 23. The other main surface serves as the electrode section of the source terminal ST. These electrode sections are formed by vapor deposition of a metal such as aluminum (Al).

An electrode section that servers as the drain terminal DT is formed on the back surface of the semiconductor chip 23. The electrode section is formed by vapor deposition of a metal such as gold (Au). The back surface of the semiconductor chip 23 is press-fit onto the die pad 21a.

An outer lead V is connected to the power supply voltage terminal VDD via a bonding wire W such as gold. An outer lead SIN is connected to the control signal input terminal IN via a bonding wire W.

In the semiconductor chip 23, the die pad 21a to which the drain terminal DT is connected, extends and thereby serves as outer leads LD3 that serve as external or outgoing lead wires. The electrode section that serves as the gate terminal GT is connected to the source-grounded terminal GND of the semiconductor chip 22 via a bonding wire W such as gold.

The electrode section that serves as the source terminal ST is connected to outer leads LS6 provided in the lead frame 20 via bonding wires W such as gold. The output terminal OUT of the semiconductor chip 22 is connected to its corresponding gate terminal GT via a bonding wire W. A voltage confirming outer lead G is connected to the output terminal OUT via a bonding wire W.

Thus, a path through which a main current flows from the source electrode of the power MOS-FET that serves as a high side switch, and a source-grounded path for driving the gate of the power MOS-FET can be separated from each other.

These die pads 20a and 21a, semiconductor chips 22 and 23, parts of outer leads V, G, SIN, LD3 and LS6, and bonding wires W are sealed with an encapsulating resin, so that a package 24 is formed.

Forming the power MOS-FET and the driver for driving the power MOS-FET by one package makes it possible to reduce the inductance of the gate terminal of the power MOS-FET and its resistance.

The power IC 19 shown in FIGS. 13 and 14 can also be applied not only to a non-insulated DC/DC converter but also to an insulated DC/DC converter.

FIG. 15 is a circuit diagram showing an insulated DC/DC converter configured using the four power ICs 19 each shown in FIGS. 13 and 14.

In this case, the insulated DC/DC converter comprises power ICs (power modules) 19a through 19d, control ICs 25, 25a, condensers 26 through 28, a coil 28a and a power transformer 29.

A configuration is adopted wherein the condensers 26 and 27 and power MOS-FETs for the power ICs 19a and 19b are respectively connected in series across an input voltage Vin. The other primary winding of the power transformer 29 is connected to a connecting portion of the condensers 26 and 27.

One primary winding of the power transformer 29 is connected to its corresponding connecting portion of the power ICs 19a and 19b. The control IC 25 is connected to control signal input terminals IN provided in the power ICs 19a and 19b.

One connecting portion of a power MOS-FET for the power IC 19c provided as a switching transistor is connected to one secondary winding of the power transformer 29. One connecting portion of a power MOS-FET for the power IC 19d provided as a switching transistor is connected to the other secondary winding of the power transformer 29.

The other connecting portion of the power MOS-FET for the power IC 19d and one connecting portion of the coil 28a are respectively connected to the other connecting portion of the power MOS-FET for the power IC 19c.

The control IC 25a is connected to control signal input terminals IN of the power ICs 19c and 19d. One connecting portion of the condenser 28 is connected to the other connecting portion of the coil 28a.

Then, an intermediate tap of the secondary winding of the power transformer 29 and the other connecting portion of the condenser 28 serve as a voltage output section of the DC/DC converter and output an output voltage Vout.

PWM (Pulse Width Modulation) signals generated by the control ICs 25 and 25a are applied to the control signal input terminals IN of the power ICs 19a through 19d so that they are controlled by the control ICs 25 and 25a.

Thus, since the gates of the power MOS-FETs provided for the power ICs 19 can be reduced in inductance and resistance in the present embodiment 3, voltage conversion efficiency can be greatly improved.

The power IC 19 may also take such a configuration that the inductance and resistance are further reduced without using the bonding wires W as shown in FIGS. 6 and 7.

As to the power IC 19 in this case, as shown in FIGS. 16 and 17, electrode sections provided in semiconductor chips 22 and 23, and outer leads V, G, SIN, LD3 and LD5 are respectively connected to one another via metal plates 30 made of aluminum (Al) or copper (Cu) or the like.

These metal plates 30 and the electrode sections of the semiconductor chips 22 and 23, and the metal plates 30 and the outer leads V, G, SIN and LD3 are respectively connected to one another via solder balls 31.

The back surface of a package 24 in the power IC 19 is formed such that lead frames 20 and 21 are respectively exposed, thereby making a further improvement in thermal dissipation. Further, the package 24 is configured in thin form.

Embodiment 4

Figure 18:
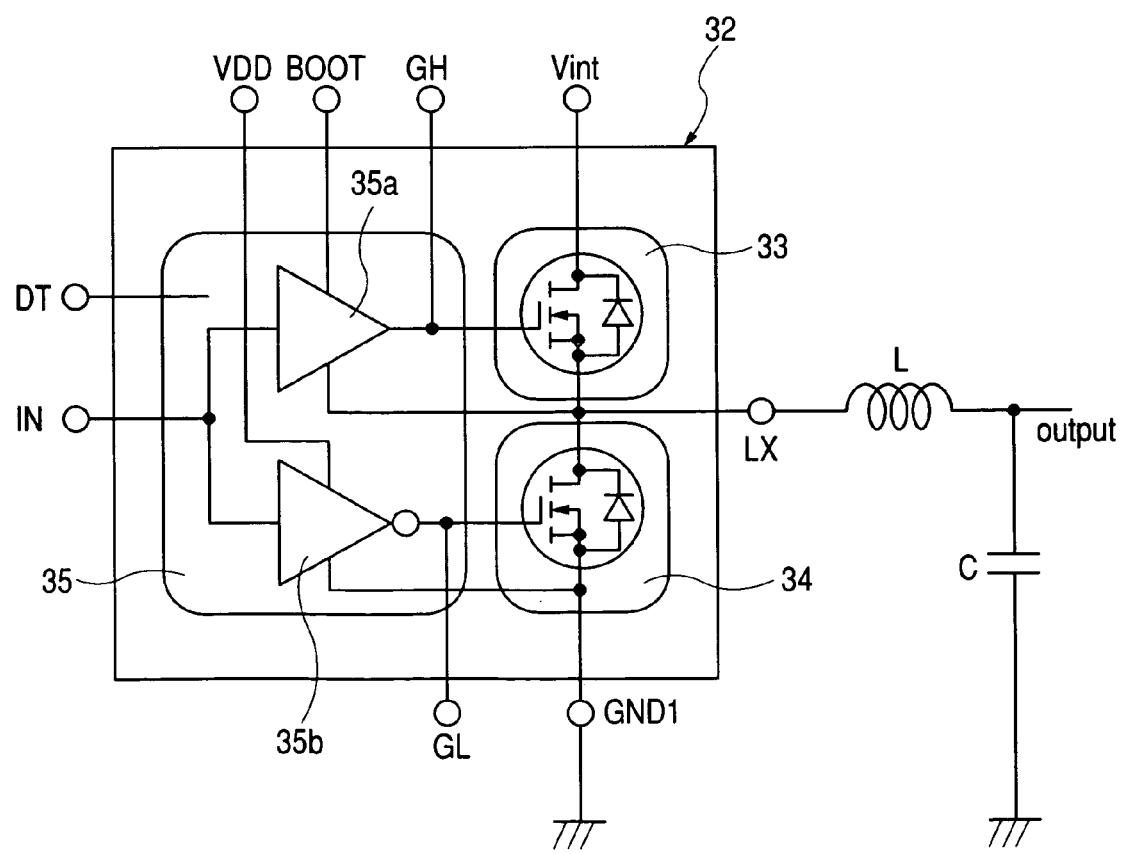
FIG. 18 is a circuit diagram depicting one example of a configuration of a power IC according to an embodiment 4 of the present invention.
Figure 19:
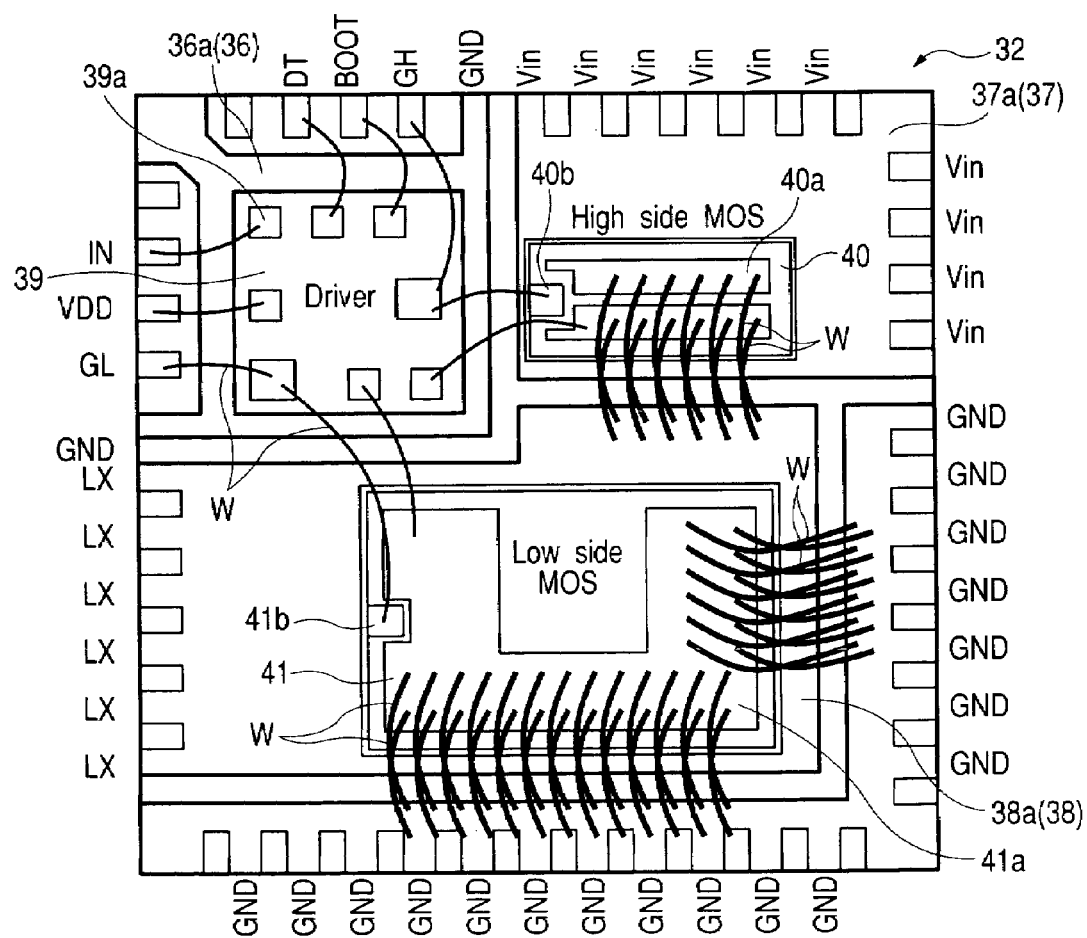
FIG. 19 is an explanatory view showing the configuration of the power IC shown in FIG. 18.
Figure 20:
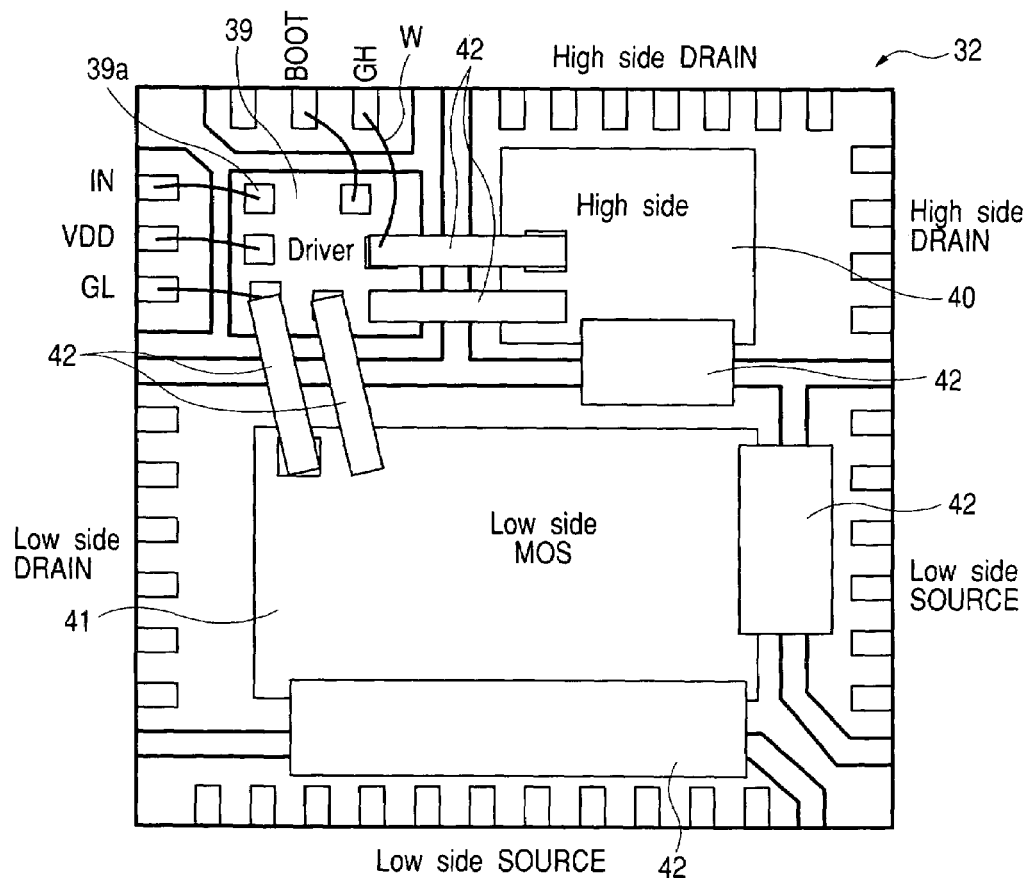
FIG. 20 is an explanatory view illustrating another configurational example of the power IC shown in FIG. 18.
Figure 21:
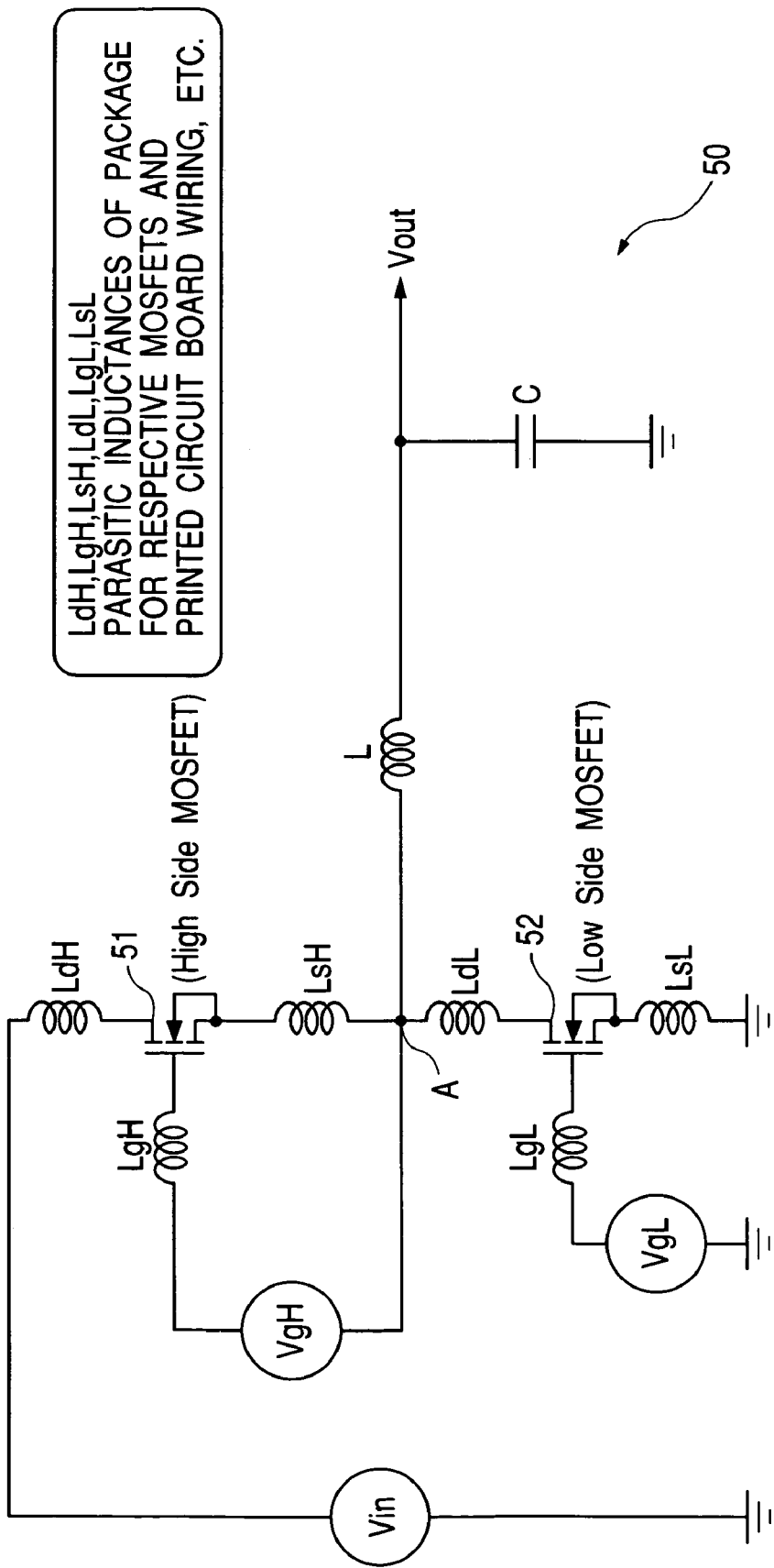
FIG. 21 is a schematic circuit configurational view of a DC/DC converter discussed by the present inventors.

FIG. 18 is a circuit diagram showing one example of a configuration of a power IC according to an embodiment 4 of the present invention, FIG. 19 is an explanatory view showing the configuration of the power IC shown in FIG. 18, and FIG. 20 is an explanatory view illustrating another configurational example of the power IC shown in FIG. 18, respectively.

In the present embodiment 4, the power IC (power module) 32 used in a non-insulated DC/DC converter is a semiconductor device in which a power MOS-FET 33 for a high side switch, a power MOS-FET 34 for a low side switch and a driver IC 35 for driving the power MOS-FETs 33 and 34 are provided in one package as shown in FIG. 18.

The power IC 32 includes, as outer leads corresponding to external terminals, a power supply voltage terminal VDD, a boot terminal BOOT, voltage confirming terminals GH and GL, a control signal input terminal IV, an input voltage terminal Vin, a ground terminal GND1 and a voltage output terminal LX.

The power supply voltage terminal VDD is a terminal to which a gate voltage is applied, and the boot terminal BOOT is a terminal for externally providing a bootstrap circuit. The voltage confirming terminals GH and GL are respectively terminals that confirm voltages to be applied to the gates of the power MOS-FETs 33 and 34.

The control signal input terminal IN is a terminal to which a PWM signal outputted from a controller IC is inputted. The input voltage terminal Vin is a terminal to which a voltage supplied to one connecting portion (drain) of the power MOS-FET 33 is inputted. The ground terminal GND1 is a grounding terminal.

The driver IC 35 comprises a driver 35a that drives the power MOS-FET 33 and a driver 35b that drives the power MOS-FET 34.

The input parts of the drivers 35a and 35b are connected to the control signal input terminal IN so that a PWM waveform is inputted. The output part of the driver 35a is connected to the gate of the power MOS-FET 33, and the output part of the driver 35b is connected to the gate of the power MOS-FET 34. The output parts of these drivers 35a and 35b are respectively connected to the voltage confirming terminals GH and GL.

A certain power supply voltage is supplied to one connecting portion of the power MOS-FET 33 via the input voltage terminal Vint. One connecting portion of the power MOS-FET 34 is connected to the other connecting portion of the power MOS-FET 33. The other connecting portion of the power MOS-FET 34 is grounded via the ground terminal GND1.

The boot terminal BOOT is connected to a power supply terminal of the driver 35a, and a connecting portion of the power MOS-FETs 33 and 34 is connected to a reference potential terminal of the driver 35a. The power supply voltage terminal VDD is connected to a power supply terminal of the driver 35b, and the ground terminal GND1 is connected to a reference potential terminal of the driver 35b.

The voltage output terminal LX is connected to the connecting portion of the power MOS-FET 33 and the power MOS-FET 34. The voltage output terminal LX serves as the output part of the power IC 32.

A package configuration of the power IC 32 will next be described.

As shown in FIG. 19, the power IC 32 comprises a QFN (Quad Flat Non-leaded package) corresponding to one non-lead surface-mounted package, for example.

The power IC 32 has a configuration wherein semiconductor chips 39 through 41 are respectively mounted on die pads 36a, 37a and 38a respectively provided in the centers of lead frames 36 through 38.

The semiconductor chip 39 corresponds to the driver IC 35 (see FIG. 18) and is provided at an upper left portion of FIG. 19. The semiconductor chip 40 corresponds to the power MOS-FET 33 (see FIG. 18) used as the high side switch and is provided on the right side of the semiconductor chip 39.

The semiconductor chip 41 corresponds to the power MOS-FET 34 (see FIG. 18) used as the low side switch and is provided below the semiconductor chips 38 and 39.

Electrode sections 39a to which a power supply voltage terminal VDD, a boot terminal BOOT, voltage confirming terminals GH, GL and a control signal input terminal IN corresponding to outer leads are connected via bonding wires W such as gold, are provided on a main surface of the semiconductor chip 39. The semiconductor chip 39 is press-fit onto the die pad 36a via a die bonding material such as silver paste or the like.

Electrode sections 40a and 40b, which serve as source and gate terminals, are respectively formed on the main surface of the semiconductor chip 40. An electrode section that serves as a drain terminal is formed on the back surface of the semiconductor chip 40.

The electrode section 40b that serves as the gate terminal is formed in part on the left side, of the main surface of the semiconductor chip 40, and the other main surface serves as the electrode section 40a for the source terminal. These electrode sections 40a and 40b are respectively formed by vapor deposition of a metal such as aluminum (Al), for example. An electrode section of the back surface of the semiconductor chip 40 is formed by vapor deposition of a metal such as gold (Au). The back surface of the semiconductor chip 40 is press-fit onto the die pad 37a.

An electrode section 41a that serves as a source terminal is formed in part on the left side, of a main surface of the semiconductor chip 41, and an electrode section 41b that serves as a gate terminal is formed on the other main surface of the semiconductor chip 41. An electrode section that serves as a drain terminal is formed on the back surface of the semiconductor chip 41.

These electrode sections 41a and 41b and the electrode section of the back surface of the semiconductor chip 40 are formed by vapor deposition of a metal such as gold (Au), for example. The back surface of the semiconductor chip 41 is press-fit onto the die pad 38a.

The electrode sections 39a, 40a, 40b, 41a and 41b provided in the semiconductor chips 39 through 41, and inner leads of the lead frames 36 through 38 located in the peripheral portions of the semiconductor chips 39 through 41 are respectively connected by bonding wires W such as gold.

These inner leads extend and thereby configure outer leads that serve as external connecting lines. The semiconductor chips 39 through 41, the inner leads of the lead frames 36 through 38, the die pads 36a, 37a and 38a and the bonding wires W are sealed with an encapsulating resin, so that a rectangular package is formed.

Even in the case of the package for the power IC 32, the back surfaces of the die pads 36a, 37a and 38a on which the semiconductor chips 39 through 41 are mounted, are exposed from the encapsulating resin to thereby greatly improve heat dissipation.

Thus, the power MOS-FETs 33, 34 and the driver IC 35 are provided in one package in the present embodiment 4, so that the inductance and resistance produced between the driver IC 35 and each of the power MOS-FETs 33 and 34 can be greatly reduced.

Since a path (gate driving path) for connecting the source terminal ST and the driver IC 35 and a path (main current path) for connecting the source terminal ST of the power MOS-FET 33 and the drain terminal DT of the power MOS-FET 34 are separated from each other in the power MOS-FET 33, the influence of parasitic inductance can be reduced and hence conversion efficiency can be greatly improved.

Further, even in the power MOS-FET 34, a gate driving circuit and a main current path are separated from each other and a backward current flows in each parasitic inductance to enable a reduction in the inductance of the gate terminal GT. Therefore, a great effect can be obtained in that self turn-on can be prevented.

Furthermore, since a backward current path can be provided from the drain terminal DT of the power MOS-FET 33 to the source terminal ST of the power MOS-FET 34, the inductance of the main circuit can be reduced.

By bringing near the semiconductor chip 40 by die-pad 38a and arranging it, the parasitic impedance between source 40a of power MOS-FET 33 as a first field effect transistor and the drain of power MOS-FET 34 as a second field effect transistor can be reduced. Moreover, semiconductor chip 41 is arranged near the corner part of die-pad 38a so that it may become ground terminals GND rather than output terminal LX closely.

By bringing near semiconductor chip 41 by the corner part of ground terminals GND and arranging it, it can do short in the wiring length of wires W coupled between the source of second field effect transistor 34 and ground terminals GND. Thereby, wiring resistance of wires W can be reduced and the standard potential GND can be stabilized further.

Furthermore, semiconductor chip 39 is arranged on die-pad 36a so that the distance between semiconductor chip 39 and semiconductor chip 40 may become shorter than the distance between semiconductor chip 39 and semiconductor chip 41.

By arranging so that the distance between semiconductor chip 39 and semiconductor chip 40 may become shorter than the distance between semiconductor chip 39 and semiconductor chip 41, the parasitic impedance between gate 40b of first field effect transistor 33 and semiconductor chip 39 can be reduced, and switching loss of semiconductor chip 33 can be improved.

By arranging these semiconductor chips 39, 40 and 41 in the predetermined position in die-pads 36a, 37a and 38a, respectively, voltage conversion efficiency of power IC 33 can be improved rather than it only arranges the semiconductor chips 39, 40 and 41 to die-pads 36a, 37a and 38a without consideration.

In FIG. 19, wires W shown by the thick line and the wires W shown by the line thinner than it are existed. The thickness of the wires W, shown by the thick line, i.e. the wires W which coupled between source 40a of first field effect transistor 33 and die-pad 38a and the wires W which coupled between source 41a of second field effect transistor 34 and ground terminals GND are of 50 micrometers. Moreover, in FIG. 19, the thickness of wires W shown by the thin line is of 30 micrometers. Accordingly, voltage conversion efficiency can be improved, the parasitic impedance between semiconductor chip 40 and output terminal LX can be reduced, and, the parasitic impedance between the ground terminals GND and the semiconductor chip can be reduced. In FIG. 19, semiconductor chip 40 and die-pad 38a are electrically connected by two or more thick wires W in parallel. Moreover, ground terminals GND are electrically connected with semiconductor chip 41 by two or more thick wires W in parallel. Thus, by connecting two or more thick wires W in parallel, the parasitic impedance for each wiring path can be reduced, and standard potential GND can also be stabilized further.

Although the present embodiment 4 has described the case in which the power IC 32 is configured using the bonding wires W, the power IC 32 may take such a configuration that the inductance and resistance is further reduced without using bonding wires as shown in FIG. 20, for example.

In the power IC 32 in this case, electrode sections 39a, 40a, 40b, 41a and 41b respectively provided in semiconductor chips 39 through 41 and inner leads of lead frames 36 through 38 are respectively connected via metal plates 42 made of aluminum or copper or the like.

These metal plates 42 and the electrode sections 39a, 40a, 40b, 41a and 41b, and the metal plates 42 and the inner leads of the lead frames 36 through 38 are respectively connected through solder balls.

Now consider where connections of the electrode sections 39a of the semiconductor chip 39 to external terminals (power supply voltage terminal VDD, boot terminal BOOT, voltage confirming terminals GH and GL and control signal input terminal IN) are made through bonding wires W.

Thus, the inductance and resistance of each connecting wiring can be further reduced owing to such connections using the metal plates 42, so that voltage conversion can be made high in efficiency.

Although the present embodiment 4 has described the case in which the power IC 32 comprises the power MOS-FET 33 for the high side switch, the power MOS-FET 34 for the low side switch and the driver IC 35 for driving the power MOS-FETs 33 and 34, the power IC may be provided with a driver controller in which a driver and a controller for generating a control signal for driving and controlling the driver are formed in one semiconductor chip.

Although the invention made above by the present inventors has been described specifically in accordance with the illustrated embodiments, the present invention is not limited to them. It is needless to say that various changes can be made thereto within the scope not departing from the gist thereof.

Advantageous effects obtained by a representative one of the inventions disclosed by the present application will be explained in brief as follows:

(1) Voltage conversion efficiency of a DC/DC converter can be greatly improved.

(2) The present invention can adapt to a large current and high frequencies without decreasing efficiency.

(3) Owing to the above (1) and (2), a power supply system can be provided which greatly improves the efficiency of power generation.

What is claimed is:

1. A semiconductor device, comprising:
 a first power transistor used as a high side switch;
 a first external connecting terminal; and
 a second external connecting terminal,
 wherein the first power transistor is formed on a semiconductor chip,
 wherein a source terminal of the first power transistor is coupled to the first external connecting terminal and to the second external connecting terminal respectively, and
 wherein the first external connecting terminal and the second external connecting terminal are respectively formed so as to be separated from each other and coupled to the source terminal by different respective coupling paths.

2. A semiconductor device according to claim 1, wherein the first external connecting terminal is coupled to the source terminal through a plate-shaped metal plate, and
 wherein the second external connecting terminal is coupled to the source terminal though a plate-shaped metal plate.

3. A semiconductor device according to claim 1, further comprising:
 a second power transistor used as a low side switch.

4. A semiconductor device, comprising:
 a first power transistor used as a high side switch;
 a second power transistor used as a low side switch;
 a driver which drives the first and second power transistors; and
 a first external connecting terminal coupled to a drain of the second power transistor,
 wherein the first power transistor is formed on a first semiconductor chip, the second power transistor is formed on a second semiconductor chip, and the driver is formed on a third semiconductor chip;
 wherein a source terminal of the first power transistor is coupled to the first external connecting terminal and to a source-grounded terminal provided in the driver, by different coupling paths respectively,
 wherein the driver has a first drive unit for driving the first power transistor and a second drive unit for driving the second power transistor, and
 wherein the source-grounded terminal is used as a low side power supply terminal of the first drive unit.

5. A semiconductor device according to claim 4, wherein the source terminal of the first power transistor is coupled to the drain of the second power transistor through a plate-shaped metal plate, wherein the source terminal of the first power transistor is coupled to the source-grounded terminal through a plate-shaped metal plate, and wherein the drain of the second power transistor is coupled to the first external connecting terminal through a plate-shaped metal plate.

6. A semiconductor device, comprising:

a first power transistor used as a high side switch;

a second power transistor used as a low side switch;

a first external connecting terminal coupled to a drain of the second power transistor; and a driver controller comprising a driver which drives the first and second power transistors, and a controller which generates a control signal for driving and controlling the driver, wherein the first power transistor is formed on a first semiconductor chip, the second power transistor is formed on a second semiconductor chip, and the driver controller is formed on a third semiconductor chip, wherein a source terminal of the first power transistor is coupled to the first external connecting terminal and to a source-grounded terminal provided in the driver controller, by different coupling paths respectively, wherein the driver controller has a first drive unit for driving the first power transistor and a second drive unit for driving the second power transistor, and wherein the source-grounded terminal is used as a low side power supply terminal of the first drive unit.

7. A semiconductor device according to claim 6, wherein the source terminal of the first power transistor is coupled to the drain of the second power transistor through a plate-shaped metal plate, wherein the source terminal of the first power transistor is coupled to the source-grounded terminal through a plate-shaped metal plate, and wherein the drain of the second power transistor is coupled to the first external connecting terminal through a plate-shaped metal plate.

8. A power supply system, comprising:

a semiconductor device which has a first power transistor used as a high side switch, a first external connecting terminal, and a second external connecting terminal;

a driver which drives the first power transistor;

a smoothing coil; and a printed wiring board on which the first power transistor, the driver and the coil are packaged, wherein a source terminal of the first power transistor is coupled to the first external connecting terminal and to the second external connecting terminal respectively, and the first and second external connecting terminals are formed so as to be separated from each other and coupled to the source terminal by different respective coupling paths, wherein the printed wiring board has a first wiring through which the first external connecting terminal of the first power transistor is coupled to the driver, and a second wiring through which the second external connecting terminal of the first power transistor and a connecting portion of the coil are coupled, and wherein the first wiring and the second wiring are formed in different coupling paths respectively.

9. A power supply system, comprising:

a power module comprising a first power transistor used as a high side switch, a second power transistor used as a low side switch, a first external connecting terminal coupled to a drain of the second power transistor, and a driver driving the first and the second power transistors;

a smoothing coil; and a printed wiring board on which the power module and the coil are packaged, wherein the first power transistor is formed on a first semiconductor chip, the second power transistor is formed on a second semiconductor chip, and the driver is formed on a third semiconductor chip, wherein a source terminal of the first power transistor is coupled to the first external connecting terminal, and to a source-grounded terminal provided in the driver, by different coupling paths respectively, wherein the printed wiring board has a first wiring between the first external connecting terminal and a connecting portion of the coil, wherein the driver has a first drive unit for driving the first power transistor and a second drive unit for driving the second power transistor, and wherein the source-grounded terminal is used as a low side power supply terminal of the first drive unit.

10. A semiconductor device suitable for use in a power supply system, comprising:

a power transistor including a control electrode, a first source electrode connected to an external terminal and a second source electrode, said power transistor being used as a high side switch of the power supply system; and a driver which is connected to the control electrode of the power transistor and to the second source electrode, and which outputs a control voltage for controlling the power transistor between the control electrode and the second source electrode, wherein the second source electrode is used as a low side power supply terminal for driving the control terminal of the power transistor.

11. A semiconductor device according to claim 10, wherein the power transistor and the driver are formed in discrete semiconductor chips.

* * * * *